United States Patent [19]

Kim et al.

[11] Patent Number: 4,859,938

[45] Date of Patent: Aug. 22, 1989

[54] NOVEL TECHNIQUE TO DETECT OXYDONOR GENERATION IN IC FABRICATION

[75] Inventors: Sang U. Kim, Tempe, Ariz.; Mohammad K. Khan, Iselin, N.J.

[73] Assignee: Intel Corporation, Santa Clara, Calif.

[21] Appl. No.: 78,094

[22] Filed: Jul. 27, 1987

Related U.S. Application Data

[63] Continuation of Ser. No. 859,619, May 5, 1986, abandoned.

[51] Int. Cl.$^4$ .................. G01R 27/26; G01R 31/00
[52] U.S. Cl. ..................... 324/158 D; 324/158 R; 324/158 SC
[58] Field of Search ......... 437/8; 324/158 R, 158 D, 324/158 T, 158 SC

[56] References Cited

U.S. PATENT DOCUMENTS

| H111 | 8/1986 | Flesner | 324/158 D |
|---|---|---|---|
| 3,495,170 | 2/1970 | Biard et al. | 324/158 R |
| 3,660,250 | 5/1972 | Duffy et al. | 324/158 D |
| 3,748,579 | 7/1973 | Henry et al. | 324/158 D |
| 3,859,595 | 1/1975 | Lang | 324/60 C |
| 3,882,391 | 5/1975 | Liles et al. | 324/158 R |
| 4,220,483 | 9/1980 | Cazcarra | 148/1.5 |
| 4,344,815 | 8/1982 | Cazarra et al. | 437/247 |
| 4,429,047 | 1/1984 | Jaztrzebski et al. | 436/4 |
| 4,456,829 | 6/1984 | Kleinknecht | 324/158 R |
| 4,581,576 | 4/1986 | Wang | 324/158 D |

FOREIGN PATENT DOCUMENTS

| 55-65144 | 5/1980 | Japan | 324/158 R |

OTHER PUBLICATIONS

"Photocapacitance Studies of the Oxygen Donor in Ga.P.I. Optical Cross Sections, Energy Levels, and Concentrations", by Kukimoto et al., Physical Review B, vol. 7, #6, 3/15/73, pp. 2486-2499.

"Frequency and Temperature Tests for Lateral Nonuniformities in MIS Capacitors", by Chang et al., IEEE Trans. on Electr. Dev., vol. ED-24, #10, 10/77, pp. 1249-1255.

"Interface State Charge in Thin-Oxide MIST Devices", by Nassibion et al., Solid State and Electron Dev., 1/79, vol 3, #1, pp. 6-10.

"Profiling of Optically Active Defects", by Greve et al., IEEE Trans. on Electron Devices, vol. ED-27, #11, 11/80, pp. 2152-2155.

*Primary Examiner*—Reinhard J. Eisenzopf
*Assistant Examiner*—W. Burns
*Attorney, Agent, or Firm*—Blakely, Sokoloff, Taylor, Zafman

[57] ABSTRACT

A novel technique to detect oxydonor generation in semiconductor wafers. Oxydonor generation in a P-type substrate may be sufficient to create a P-N junction within the substrate which may adversely affect device performance. A technique of the present invention is a two-step process for determining the presence of such an oxydonor generated P-N junction. For a capacitor device, the capacitance of the device is measured under varying test voltages to determine a capacitance-voltage response. Then a second capacitance-voltage response is measured when the device is subjected to an external energy source. For a diode device, the forward current is measured with the device under varying test voltages to determine a current-voltage response. Then a second currrent-voltage response is measured when the device is subjected to an external energy source. By comparing device response with and without the application of external energy, a device having oxydonor generation problems is efficiently detected.

5 Claims, 5 Drawing Sheets

Fig. 14

NOVEL TECHNIQUE TO DETECT OXYDONOR GENERATION IN IC FABRICATION

This is a continuation of application Ser. No. 859,619 filed May 5, 1986; now abandoned.

BACKGROUND OF THE INVENTION

1. Field of the Invention

This invention relates to improved techniques for detecting oxydonor generation in semiconductor wafers.

2. Prior Art

Oxydonor generation in semiconductor wafers is a well-known problem encountered in manufacturing semiconductor chips. Typically, a silicon substrate, having a silicon crystal lattice structure, is used as a P-type substrate in forming a foundation for a semiconductor device. An acceptor atom, such as boron, is used as a dopant to form a P-type substrate. Oxygen atoms, which are normally introduced interstitially within the lattice structure, tend to exchange places with silicon atoms and effectively perform as a donor dopant (therefore the term oxydonor generation). This oxydonor generation increases oxygen concentration introduced in the silicon substrate during crystal growth. Oxydonors are generated at low process temperature ranges of 350–500 degrees C., an optimal temperature being 450 degrees C.

The presence of negatively charged oxydonor atoms tend to cancel the positive charge of the acceptor dopant. When oxydonor generation occurs at a significantly high concentration, a significant change in the substrate resistivity will occur so that a part of the substrate is inverted into a N-type, resulting in a formation of a P-N junction. Such a drastic change in the substrate resistivity will cause a detrimental effect on device performance and reliability or device failures. Therefore, prior to or during the manufacturing process, oxydonor generation must be detected to prevent fabrication and subsequent distribution of defective semiconductor devices.

The oxydonor generation problem increases substantially when high resistivity substrate (those having less P-type dopant) is used to improve device performance, as is the case today with products such as EPROMS, ROMS, microprocessors and microcontrollers. Low temperature process technologies, which are increasingly used to shrink device dimensions, is prone to thermal oxydonor generation.

Various techniques exist to determine oxydonor generation in P-type substrates, such as punch-through voltage, determining forward voltage drop of P-N diodes, and sheet resistivity measurements. The sheet resistivity technique is the most reliable and accurate, however, the resistivity technique is very time consuming, usually requiring several hours. Further, special tools which are costly are required to perform the sheet resistivity measurement. The punch-through technique, although being accurate, can not be used if the N-inversion layer is formed deep in the silicon substrate as is often the case. Similarly, with the diode voltage drop technique, it becomes difficult to interpret the results if a weak inversion occurs deep in the substrate.

It is appreciated that a new technique which is highly reliable and accurate requiring no special tools and which is non-destructive to the material is needed. Further, such technique must be capable of obtaining results in a short span of time, not hours, and present no ambiguity in the interpretation of the results.

SUMMARY OF THE INVENTION

The present invention discloses a novel technique to detect oxydonor generation in integrated circuit fabrication. Oxydonor generation, which is an inherent problem encountered in P-type substrates introduces unwanted negative donor atoms within a predominantly, positively charged acceptor substrate. Interstitially located oxygen atoms within a typical P-type substrate, such as a silicon substrate, interact with the crystal lattice structure and become donors within this particular substrate. Typically, oxygen atoms near the surface of the substrate diffuse into the atmosphere wherein an oxydonor free positive region is created near the surface of the substrate. However, oxygen atoms within the interior of the substrate tend to form oxydonors. The oxydonor generation within the interior of the substrate causes a bifurcation of a positive region near the surface of the substrate and a negative inversion region toward the interior, wherein two distinct P and N regions are created within the substrate. The two distinct P and N regions cause a P-N junction to form within the substrate, which can cause undesirable operation of the device, or worse, failures of the device. This oxydonor generation effect is quite noticeable in low temperature processing of VLSI technology of today, especially where high resistivity substrates are used for better device performance.

The technique is a simple two-step process, wherein during the first step, a voltage is applied to the device and certain circuit parameters are observed. During the second step, the same voltage is applied to the device, however, the device is subjected to an external energy source, such as light or heat. Again, certain circuit parameters are measured and the second set of measurements are compared to the first to determine if the device has undergone oxydonor generation.

In one embodiment of the invention, a capacitor device is subjected to the technique. When the substrate does not undergo oxydonor generation, a negative or positive voltage on the gate will result in appreciably little difference between light and no light conditions. If the device undergoes oxydonor generation, a negative voltage at the gate will result in increased capacitance under light conditions.

In the alternative embodiment, a diode device is tested using the technique. The diode device having a N+ −region within the P-type substrate will display a typical diode characteristic when a forward voltage is applied to the device. When the device is subjected to light or heat, the diode characteristic is essentially the same. However, a device undergoing oxydonor generation will present a P-N junction deep within the substrate wherein a bipolar transistor characteristic is created within the device such that when the device is subjected to the technique, the device will typically respond having a bipolar transistor characteristic, instead of a P-N diode characteristic, when subjected to heat or light.

DETAILED DESCRIPTION OF THE PRESENT INVENTION

The present invention describes a novel technique to detect oxydonor generation in P-type substrates. In the following description, numerous specific details are set forth such as specific voltages, etc., in order to provide a thorough understanding of the present invention. It will be obvious, however, to one skilled in the art that the present invention may be practiced without these specific details. In other instances, well-known processes have not been described in detail in order not to unnecessarily obscure the present invention.

Figure 1:
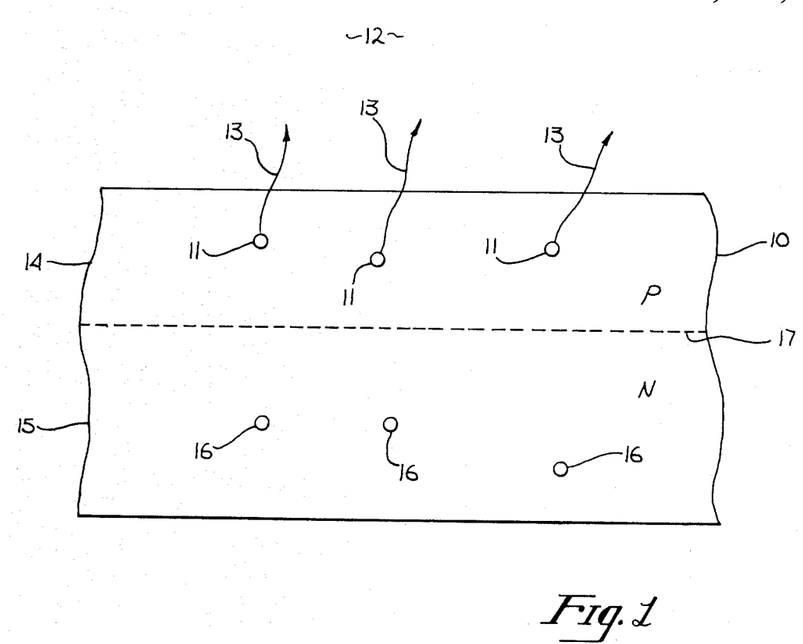
FIG. 1 is a cross-sectional view of a P-type substrate having an oxydonor generated region, wherein a N inversion layer is generated.

Referring to FIG. 1, a most prevalent and undesirable result of oxydonor generation is shown. A P-type substrate 10 comprised of an acceptor doped silicon wafer is shown. When substrate 10 is exposed to a high temperature process cycle, interstitially located oxygen atoms 11 diffuse from substrate 10 to atmosphere 12 as shown by arrows 13. This diffusion process depletes an upper portion 14 of the substrate 10 of interstially located oxygen atoms. However, such surface diffusion is limited to a depth of approximately 10-20 microns. This oxygen depleted region 14, termed as a denuded zone, is not affected by oxydonor generation because of the lack of oxygen atoms to react within the crystal structure of the silicon.

Lower region 15 being interior from the atmosphere cannot readily release interstitial oxygen atoms 16. These oxygen atoms 16 remain within region 15 and during a heating cycle, will react with the silicon lattice structure to form oxydonors, a process well-known in the manufacture of semiconductor devices. When significant numbers of oxydonors are generated, such that the negative charges of the oxydonor atoms are more in abundance than the P-type acceptor in the region 15, region 15 will take on a characteristic of a N-type material.

Because the upper region 14 is positive (P-type) and lower region 15 is effectively negative (N-type), a P-N junction 17 forms between the two regions 14 and 15. The formation of this unwanted P-N junction 17 in a silicon substrate is the classic problem of oxydonor generation. The present invention describes a novel technique of determining the existence of this P-N junction 17 within substrate 10 when either a capacitor or a diode is formed using substrate 10.

C-V TECHNIQUE FOR CAPACITORS

Figure 2:
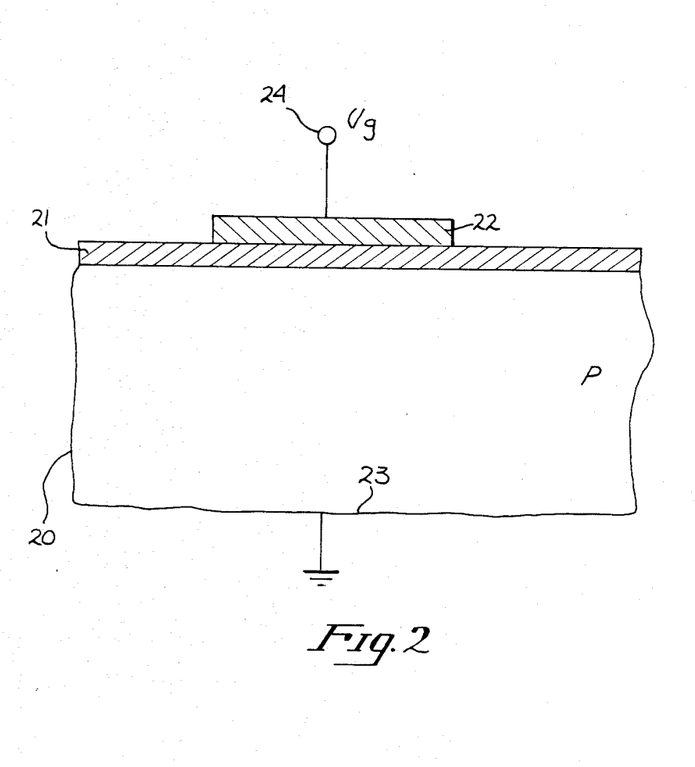
FIG. 2 is a cross-sectional view of a capacitor constructed from a P-type substrate having no oxydonor generation.

FIG. 2 illustrates the formation of a typical capacitive device on a P-type silicon substrate 20. An oxide layer 21 is formed on substrate 20 and then a metal or polysilicon gate 22 is formed on oxide 21. The oxide 21 between gate 22 and substrate 20 performs as a dielectric between two conducting elements 20 and 22, which are essentially plates of a capacitor.

Figure 3:
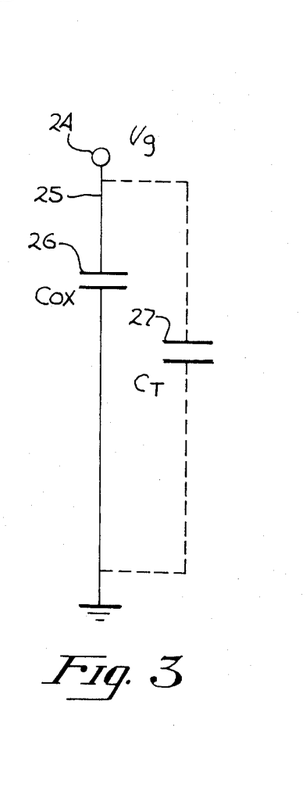
FIG. 3 is an equivalent circuit diagram showing the capacitor of FIG. 2 and a voltage source applied to the capacitor for measuring oxydonor generation.

A voltage potential 24 (Vg) is placed across gate 22 and opposite end 23 (ground) of substrate 20. The C-V (capacitance-voltage) technique used employs high-frequency 1 MHz measurements which are routinely practiced in device characterization in the semiconductor industry. Also referring to FIG. 3, circuit diagram 25 illustrates an equivalent representation of capacitor 26 (having a value Cox) formed by oxide 21, gate 22 and substrate 20, as well as the application of voltage across capacitor 26. Capacitor 27 represents the total capacitance value (Ct) as measured across the potential 24 and ground 23. FIG. 2 illustrates a condition when oxydonor generation is not significant to cause problems within the substrate 20. Therefore, the entire substrate 20 retains a P-type characteristic.

Figure 4:
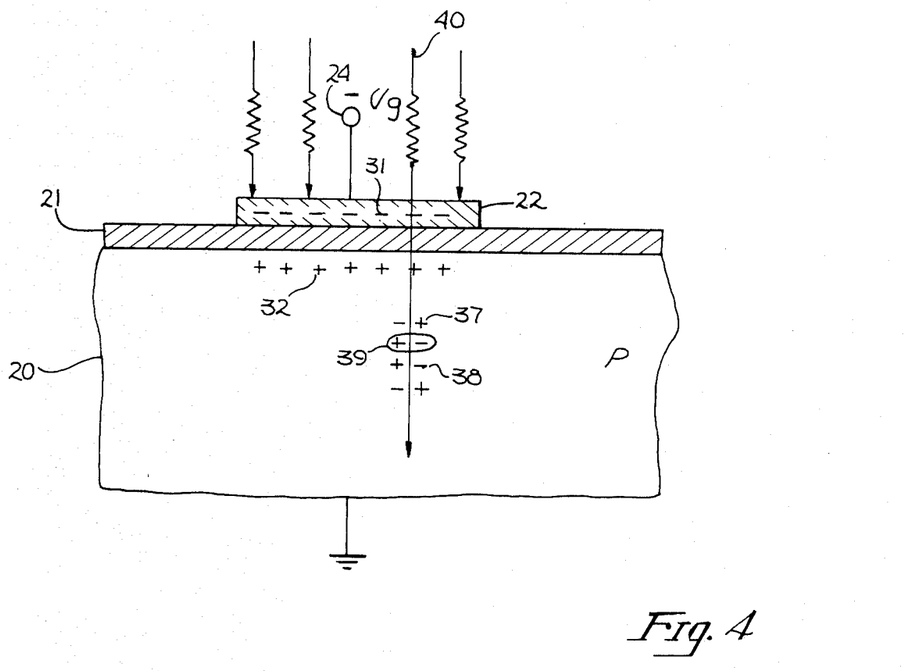
FIG. 4 is a cross-sectional view of the capacitor of FIG. 2 when a negative test voltage is applied to the device.

FIG. 4 illustrates a condition when voltage 24 (Vg) is negative, an accumulation condition. Negative charges (electrons) 31 collect on gate 22 and cause positive charges 32 (holes) within substrate 20 to collect near the oxide 21 opposite gate 22. A capacitance measuring device (not shown), one of any number of prior art devices, measures the capacitance value (Ct) of capacitor 27 as Vg is increased in magnitude. For a typical P-type substrate, the capacitance value of capacitor 26 increases sharply at first as Vg is increased negatively from zero volts, but stabilizes at a level value equal to the oxide capacitance, Cox, as voltage continues to increase further. This response occurs because charges 31 and 32 collect immediately near oxide 21 as voltage is applied, thereby increasing the capacitance value of capacitor 26, but further increases in the magnitude of Vg does not enhance the capacitance value of capacitor 26 once charge storage has reached a saturation point, because the oxide capacitance value has been reached.

Figure 5:
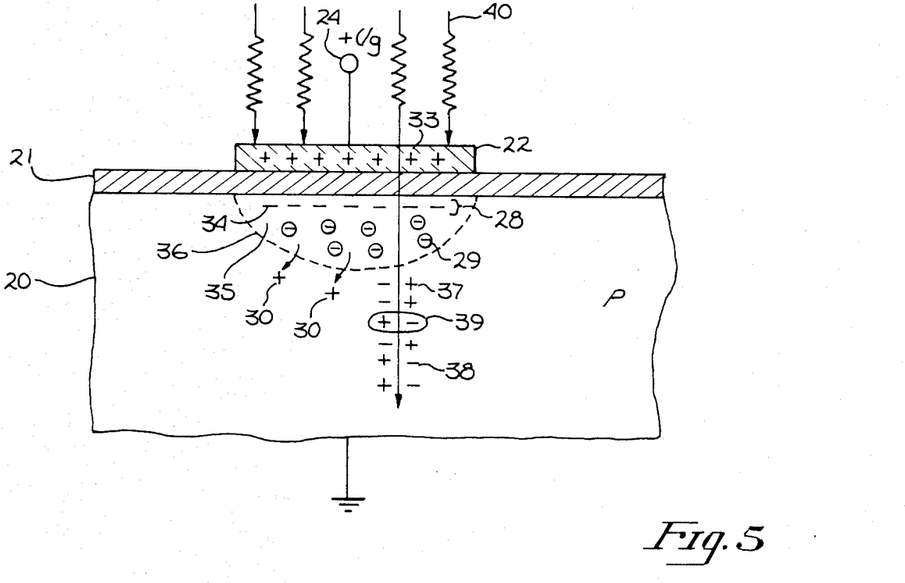
FIG. 5 is a cross-sectional view of the capacitor of FIG. 2 when a positive test voltage is applied to the device.

FIG. 5 illustrates a condition when voltage 24 (Vg) is positive, an inversion condition. The positive voltage 24 initially creates a depletion region 35, as shown by dotted line 36; by repelling holes 30 from the acceptor atoms of the substrate 20, wherein ionized acceptor atoms 29 are exposed. As the gate voltage 24 is further increased, positive charges 33 on gate 22 attract more electrons 34 toward the oxide 21, which form an inversion layer 28 within the depletion region 35. When this occurs, the capacitance of capacitor 26 again stabilizes to the oxide capacitance Cox. The inversion and depletion areas form two capacitances in series, with the inversion layer capacitance (Cinv) adding to Cox and depletion region capacitance (Cdep) being in series to Cox. Because the two capacitance Cox and Cdep are in series, a significant decrease occurs in the total capacitance Ct.

Figure 6:
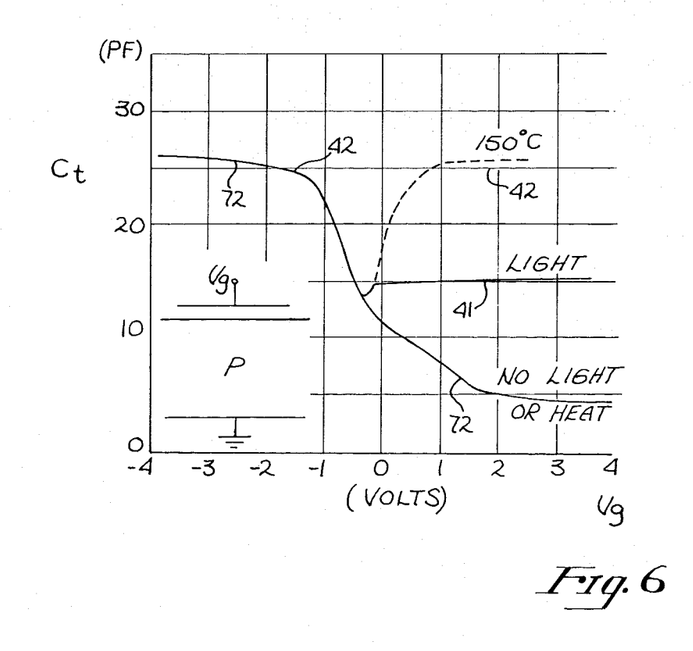
FIG. 6 is a graph illustrating a C-V characteristic response when the device, having no oxydonor generation, is subjected to varying test conditions.

Referring to FIG. 6, a C-V characteristic of Vg versus Ct is shown as Vg is varied across the negative and positive ranges. Curve 72 illustrates the response of Ct to Vg as described above.

Referring to FIGS. 2-6, a different characteristic response is observed when the substrate 20 is subjected to external source of energy 40, such as light or heat. Energy 40 generates a plurality of electron-hole pairs 39 comprised of electrons 38 and holes 37. In the instance Vg is negative, the light or heat induced electron-hole pairs 39 have little effect to the holes 32 already located at oxide 21, the capacitance Ct remains equivalent to Cox. Therefore, the relationship of capacitance to voltage Vg is essentially equivalent to that of curve 72 when Vg is negative.

However, when Vg is positive, as is described above, both inversion layer 28 and depletion region 35 is formed resulting in the oxide capacitance Cox and depletion capacitance Cdep in series. Because of the depletion region formed, the capacitance initially decreases. As the gate voltage 24 increases further, the inversion layer 28 is formed. When this occurs, Cinv adds to Cox, and Ct increases accordingly, as electrons 38 are drawn to inversion layer 28, eventually reaching the oxide capacitance depending on the energy 40 intensity.

Curve 41 shows the instance when light energy, in the form of photons, bombards substrate 20. Curve 42 shows the instance when the energy source is heat. Curve 41 is lower than curve 42 because the light energy is not at a higher intensity level. Curve 41 will become coincident to curve 42 when light energy becomes comparable to heat energy in curve 42.

Figure 8:
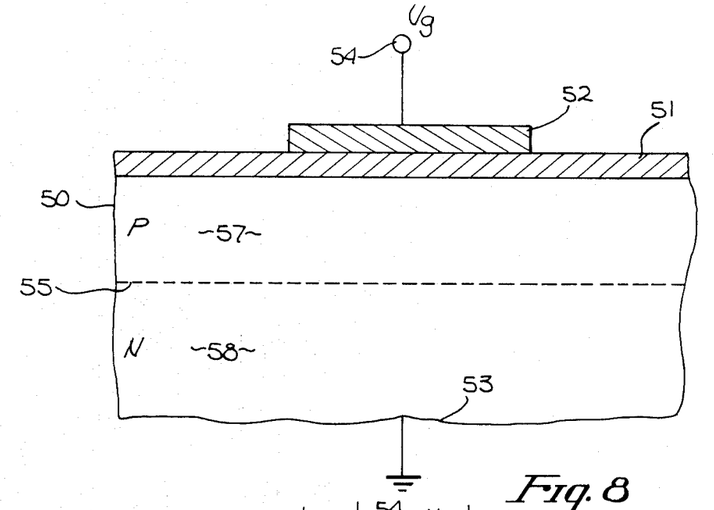
FIG. 8 is a cross-sectional view of a silicon substrate having oxydonor generation induced P-N junction within the substrate.
Figure 9:
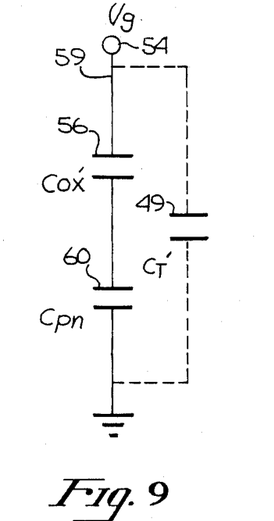
FIG. 9 is an equivalent circuit diagram showing the capacitor and the additional capacitance inherent in the P-N junction of FIG. 8.

FIGS. 8 and 9 illustrate an undesirable condition when oxydonor generation is encountered in a P-type substrate 50. The formation of capacitor 56 having a value Cox' is as equivalent to capacitor 26 of FIGS. 2-5, as well as capacitor 49 having a total capacitance value Ct' is equivalent to Ct. An oxide layer 51 is formed on substrate 50 and gate 52 is formed on oxide 51. However, due to oxydonor generation (as explained in the description of FIG. 1), a P-N junction 55 is formed within substrate 20 separating a P-region 57 from a N-region 58. The circuit 59 shows an equivalent schematic of the formation of capacitor 56 and a second capacitor 60 which is formed as a result of charges collected on the P-N junction 55. The capacitor 60, denoted as having value Cpn, is in series to capacitor 56 when voltage potential 54 is applied across gate 52 and opposite end (ground) 53 of substrate 50. Because capacitors 56 and 60 are in series, the total capacitance (Ct') is calculated as $Ct' = (Cox' \times Cpn)/(Cox' + Cpn)$.

Figure 10:
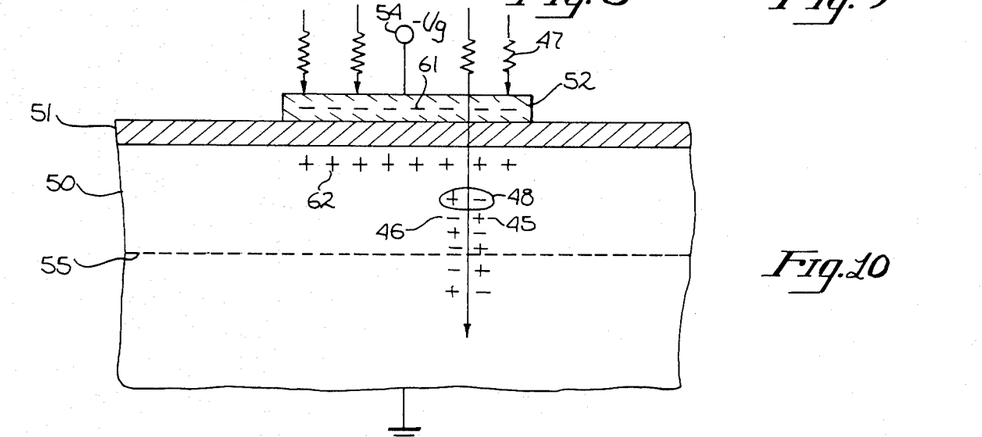
FIG. 10 is a cross-sectional view of the device in FIG. 8 when a negative test voltage is applied to the device.

Referring to FIG. 10, it shows a condition when Vg is negative. The accumulation of holes 62 and electrons 61 near oxide 51 is equivalent to the description given for FIG. 4. Electrons 61 collect on gate 52 due to the negative potential $-Vg$ and holes 62 collect within substrate 50 near oxide 51 opposite gate 52. However, because of the P-N junction 55 and capacitance Cpn, the total capacitance Ct' is less than the normal typical value encountered when no P-N junction is present, as in FIG. 4. This is because the P-N diode junction is reverse biased when the gate 52 is negative. Because the reverse biased capacitance Cpn is comparatively smaller than Cox', the total capacitance Ct' is affected by Cpn, resulting in the decrease of Ct'. Hence, when oxydonor generation occurs and creates a P-N junction 55, the capacitor value Ct' reading is less than normal.

Figure 11:
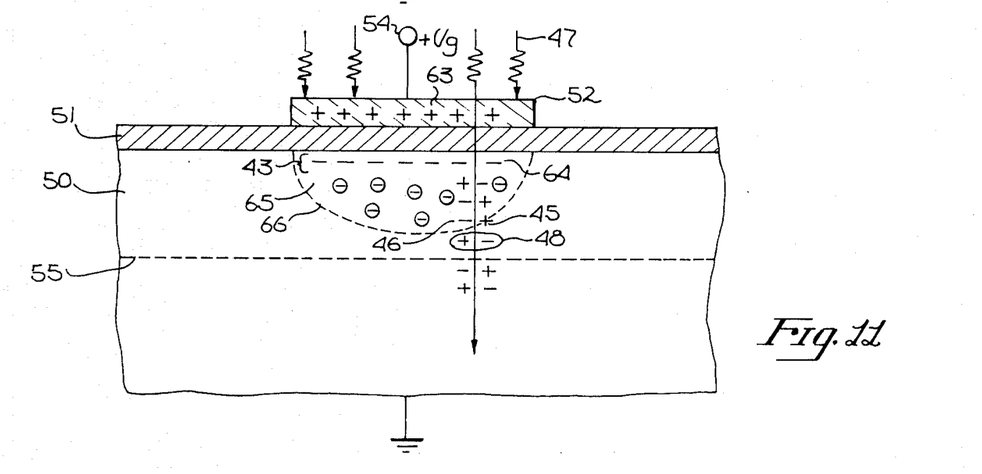
FIG. 11 is a cross-sectional view of the device in FIG. 8 when a positive test voltage is applied to the device.

Referring to FIG. 11, it shows a condition when Vg is positive. The accumulation of holes 63 and electrons 64 near oxide 51 is equivalent to the description given for FIG. 5. Holes 63 collect on gate 52 due to the positive potential $+Vg$ and electrons 64 collect within substrate 50 near oxide 51 opposite gate 52. The accumulation of electrons 64 forms an inversion layer 43 and a depletion region 65, as shown by dotted lines 66, within substrate 50. Since the N-type region 65 is forward biased in this instance, the contribution of capacitance Cpn is negligible. Therefore, when positive potential $+Vg$ is applied, the C-V response of a substrate 50 having an oxydonor generated P-N junction 55 is similar, to that of a substrate having no such oxydonor generation problem.

Figure 7:
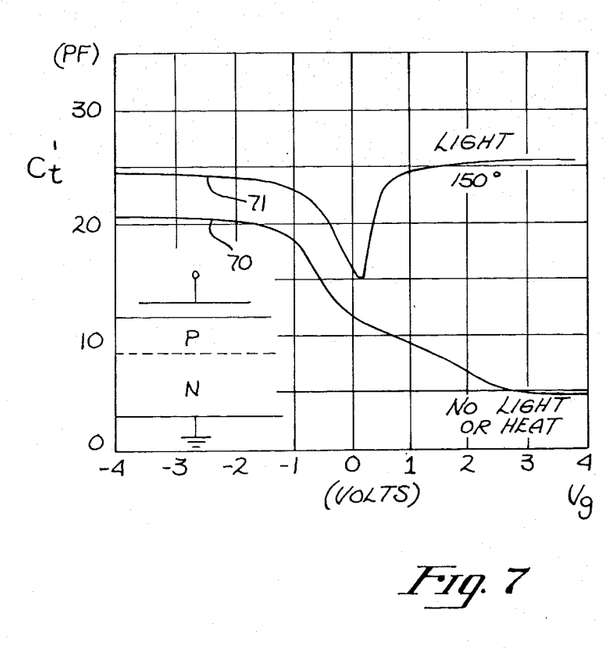
FIG. 7 is a graph illustrating typical C-V characteristic responses of an oxydonor generated substrate under varying test conditions.

Referring to FIG. 7, a graph of voltage Vg versus capacitance Ct' is shown. Curve 70 illustrates a typical response of a substrate having a P-N junction created by oxydonor generation with no external source of energy.

Referring to FIGS. 7-11, a different characteristic response is observed when the substrate 50 is subjected to external source of energy 47, such as light or heat. Energy 47 generates a plurality of electron-hole pairs 48, comprised of electrons 46 and holes 45, similarly to the description given for FIGS. 2-5. In the instance Vg is negative, the P-N junction 55 becomes reverse biased, reducing capacitance Cpn. The total capacitance Ct' becomes significantly smaller with oxydonor generation as described earlier. However, when the substrate 50 is subjected to light or heat energy 47, the capacitance Ct' increases, eventually recovering to that of a substrate having no oxydonor generation. This is because the light (or heat) generated electron-hole pairs 48 readily flow across the P-N junction 55 under the reverse biased junction electric field as was the case of a forward biased condition. The contribution of the reverse biased P-N junction 55 is negligible with external energy 47, either be it heat or light.

In the instance Vg is positive, the P-N junction 55 is forward biased, and the capacitance Cpn contribution is negligible. Therefore, curve 71 in FIG. 7 becomes equivalent to curve 42 of FIG. 6. That is when Vg is positive, there is no difference between oxydonor and non-oxydonor generation characteristic under subjection to external energy 47.

Referring to FIGS. 6 and 7, curves 72, 41, 42, 70 and 71 clearly illustrate the distinctions of applying the technique of the present invention to determine if a particular substrate is prone to an oxydonor generation problem. A C-V characteristic response of a substrate is measured first without any external energy source, such as light or heat. Then that same substrate is subjected to an external energy source. A second C-V characteristic response of the substrate is measured and a comparison of both results is made. If the capacitance values show a difference with Vg negative as shown in curves 70 and 71, then the substrate has an oxydonor problem. If the curves show no difference under the same conditions, there is no oxydonor generation. Therefore, in practice, C-V measurements with the gate voltage negative is only required.

Although the preferred embodiment uses an external light source, any external energy source may be used, such as heat. The heat source is more advantageous since a special high energy light source is required when oxydonor induced P-N junction is created in the deeper interior of the substrate. Heat sources do not have such penetration problems.

DIODE CHARACTERISTIC

Figure 12:
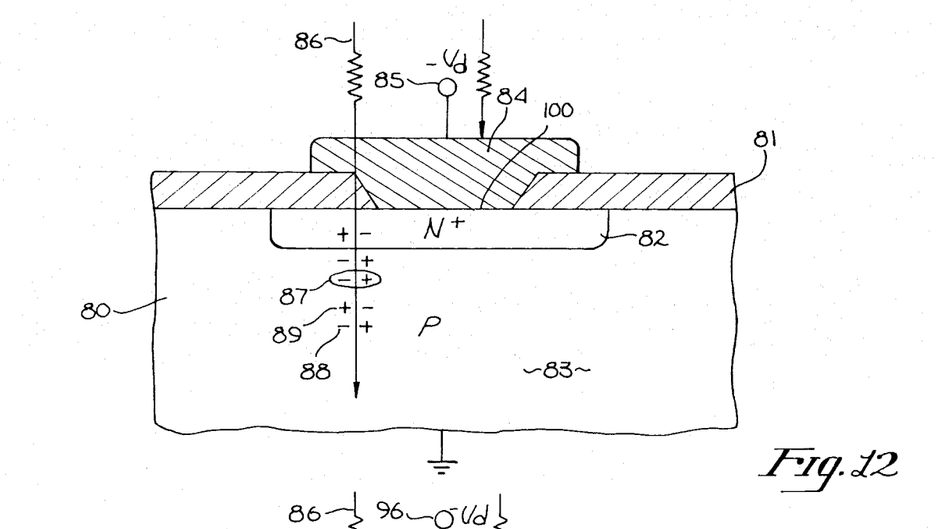
FIG. 12 is a cross-sectional view of a semiconductor diode device having a typical P-type substrate having no oxydonor generation.

A similar technique is used to test a diode semiconductor device. In FIG. 12, a typical diode is shown. A p-type silicon substrate 80 typically has an N+ diffusion region 82 to provide the P-N+ junction of a diode. Usually an oxide layer 81 is formed above the substrate 80 and diffusion region 82. Then a window 100 is cut in oxide 81 to expose N+ region 82, wherein a metal gate 84 is formed within window 100. An external voltage source 85 (Vd) is placed across the gate 84 and P-region 83 of substrate 80, allowing for a forward diode current to flow.

Figure 13:
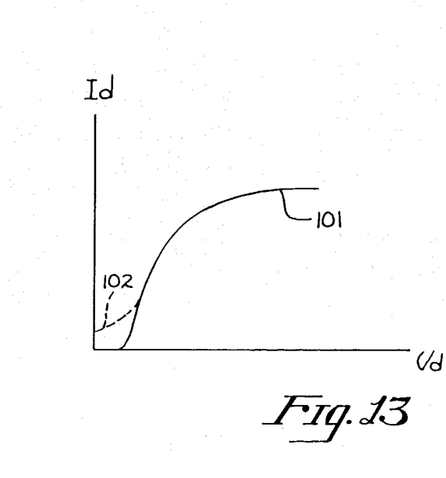
FIG. 13 is a graph showing a forward voltage and current characteristic of the device of FIG. 12 under varying test conditions.

Also referring to FIG. 13, FIG. 13 shows a graph of diode voltage Vd versus diode current Id in a forward bias mode. Curve 101 shows a typical diode characteristic curve of a typical diode as shown in FIG. 12. Whenever an external energy source 86, such as light or heat, generates electron-hole pairs 87, comprised of electrons 88 and holes 89, in the substrate 80, the holes 89 are attracted to negative region 82, while electrons 88 move toward grounded substrate 80, contributing to the forward diode current. However, the overall diode current does not change appreciably except in the low current region 102. This is because the forward diode current predominates in the high current region.

Figures 14, 15:
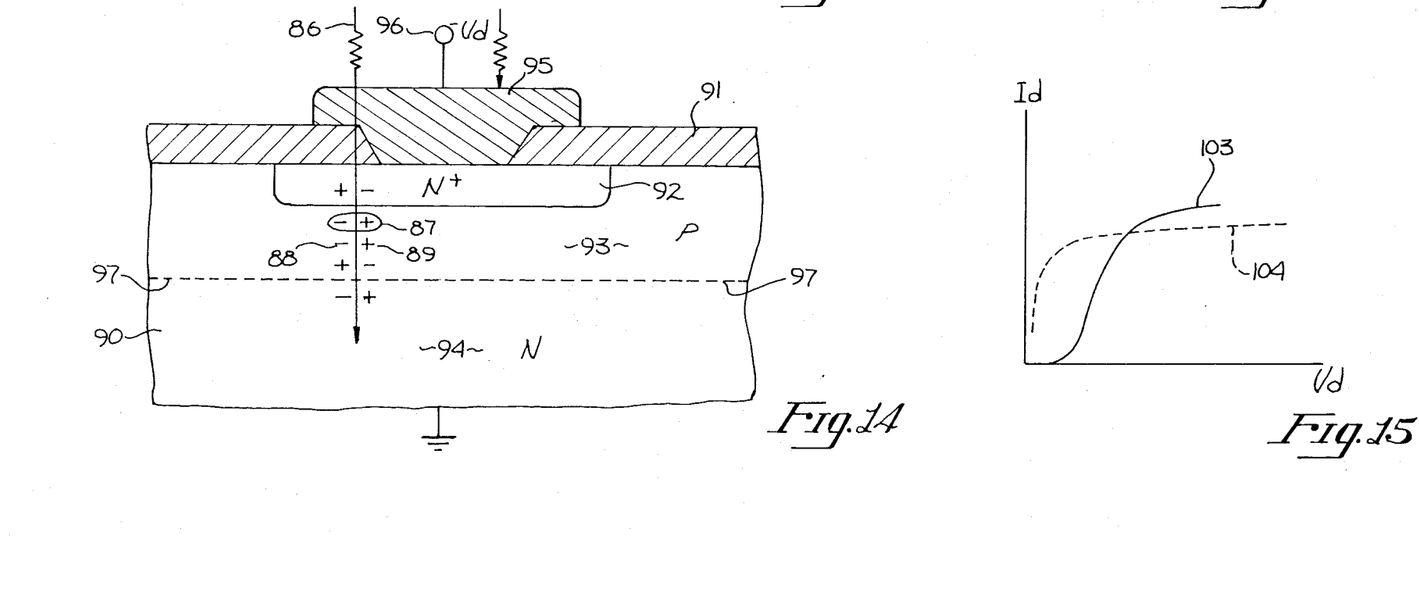
FIG. 14 is a cross-sectional view of a semiconductor diode device having oxydonor generated P-N junction within a P-type substrate.
FIG. 15 is a graph showing a forward voltage and current characteristic of the device of FIG. 14 under varying test conditions.

Referring to FIG. 14, it shows a substrate 90 having an oxydonor generation problem. Because of the oxydonor generation within substrate 90, a P-N junction 97 is formed, creating an upper P-region 93 and lower N-region 94 as described in the earlier phase of the application under the description of capacitor characteristic. An n+ region 92, oxide 91 and gate 95 are formed similarly to the description given for the diode device of FIG. 12. An external negative voltage source 96 is impressed across gate 95 and region 94 of substrate 90 (as was done in FIG. 12).

Referring also to FIG. 15, it shows a gate voltage and forward current characteristic curve, as was shown in FIG. 13. Typically, the device of FIG. 14 will display a diode characteristic as such shown by curve 103. However, in this instance, two P-N junctions are created forming an N+ — P-N configuration by regions 92, 93 and 94. This N+ — P-N configuration is basically that of a N+ — P-N transistor, wherein the P-region 93 acts as the base of the transistor. Therefore, when significant oxydonor generation is encountered creating N-region 94, the diode device of FIG. 14 will operate as a bipolar transistor. When the transistor is subjected to the external energy source 86, such as light or heat, holes 89 from the generated electron-hole pairs 87 move toward the N+ region 92 and the electrons toward the N collector region 94. Thus the hole current becomes a base current, wherein the bipolar transistor is activated with high energy exposure. Curve 104 exhibits a typical bipolar transistor characteristic response and as can be seen from the drawing, transistor curve 104 is significantly different than diode characteristic curve 103.

Therefore, by observing the gate voltage and forward current measurement of a diode device with and without light, a substrate can be tested for the presence of oxydonor generation.

We claim:

1. A method for nondestructive detection of oxydonor generation in a semiconductor diode device which includes a gate, a P-type silicon substrate having a N+ region disposed therein, such that said N+ region is disposed between a P-region of said substrate and said gate to form a P-N+ diode, and wherein presence of oxydonors causes a further P-N junction to be formed in said substrate, comprising the steps of:

placing a forward biased voltage potential across said diode device;

measuring a forward current value of said diode device;

subjecting said device to an external source of energy;

measuring again said forward current of said diode device;

comparing measurement of said forward current without said external source energy to measurement of said forward current with said external source of energy;

wherein oxydonor generation is detected to be present in said substrate, if said forward current values are substantially different with and without said external source of energy.

2. The method of claim 1, wherein said voltage is varied across a negative range of values.

3. The method of claim 2, wherein said external source of energy is light.

4. The method of claim 2, wherein said external source of energy is heat.

5. The method of claim 2, wherein said forward current displays a P-N diode characteristic without said external source of energy, but displays a N+ — P-N transistor characteristic when subjected to said external source of energy when oxydonor generation is present.

* * * * *

UNITED STATES PATENT AND TRADEMARK OFFICE
CERTIFICATE OF CORRECTION

PATENT NO. : 4,859,938
DATED : August 22, 1989
INVENTOR(S) : Kim et al.

It is certified that error appears in the above-identified patent and that said Letters Patent is hereby corrected as shown below:

In column 7 at line 45 change "eariler" to --earlier--.

Signed and Sealed this

Twenty-second Day of August, 1995

Attest:

BRUCE LEHMAN

Attesting Officer     Commissioner of Patents and Trademarks